(12) United States Patent
Matsuda et al.

(10) Patent No.: US 8,087,953 B2
(45) Date of Patent: Jan. 3, 2012

(54) SURFACE MOUNT DEVICE JUMPER AND SURFACE MOUNT DEVICE JUMPER ASSEMBLY

(75) Inventors: Yoshinari Matsuda, Chula Vista, CA (US); Rogelio Ruiz, Tijuana (MX)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 910 days.

(21) Appl. No.: 12/078,496

(22) Filed: Apr. 1, 2008

(65) Prior Publication Data

US 2009/0242237 A1    Oct. 1, 2009

(51) Int. Cl.
  *H01R 31/08* (2006.01)
  *H05K 7/06* (2006.01)
(52) U.S. Cl. ........... 439/507; 439/78; 439/885; 174/261
(58) Field of Classification Search .................. 439/507, 439/885, 78, 876; 174/250, 261
See application file for complete search history.

(56) References Cited

U.S. PATENT DOCUMENTS

| | | | | |
|---|---|---|---|---|
| 4,907,991 A | * | 3/1990 | Kobayashi | 439/876 |
| 5,163,850 A | * | 11/1992 | Cronin | 439/507 |
| 5,562,489 A | * | 10/1996 | Cronin | 439/507 |
| 5,633,069 A | * | 5/1997 | Shimizu et al. | 428/192 |
| 5,695,348 A | | 12/1997 | Legrady | |
| 5,711,681 A | * | 1/1998 | Hasegawa | 439/86 |
| 6,199,264 B1 | | 3/2001 | Marcou et al. | |
| 6,428,349 B1 | * | 8/2002 | Dickson et al. | 439/513 |
| 2002/0144841 A1 | * | 10/2002 | Hua et al. | 174/261 |
| 2004/0002257 A1 | * | 1/2004 | Katayama | 439/507 |

\* cited by examiner

*Primary Examiner* — Hien Vu
(74) *Attorney, Agent, or Firm* — Rader, Fishman & Grauer PLLC

(57) ABSTRACT

A surface mount device jumper includes a base member and an electrode member. The base member is fabricated from a resin laminate. The electrode member is fabricated from an electrically-conductive material and is formed in a generally C-shaped configuration to define an opening therethrough. The opening is sized to receive the base member such that the electrode member partially wraps around and clamps to the base member to retain the base member in the opening.

17 Claims, 16 Drawing Sheets

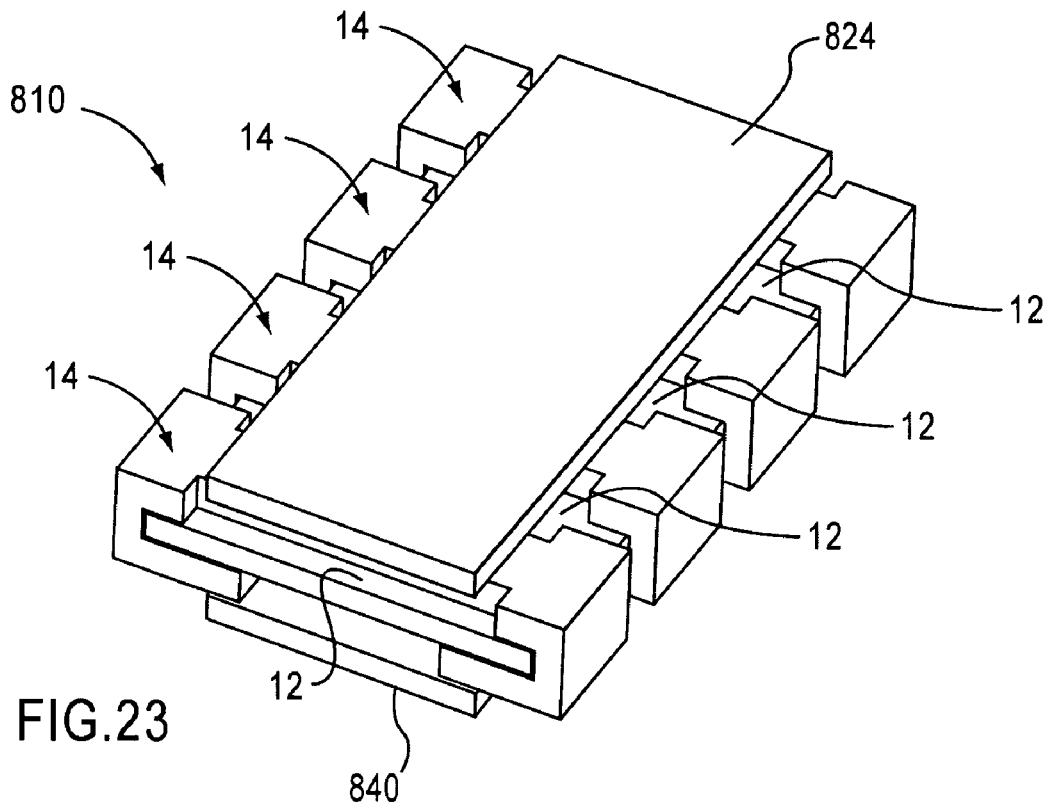
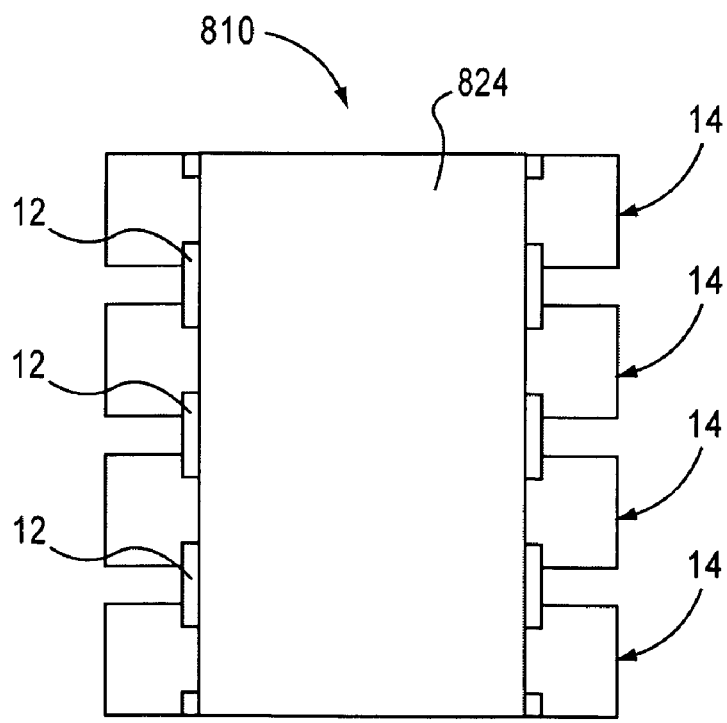
FIG.23
FIG.24

SURFACE MOUNT DEVICE JUMPER AND SURFACE MOUNT DEVICE JUMPER ASSEMBLY

FIELD OF THE INVENTION

The present invention relates to a surface mount device jumper. More particularly, the present invention is directed to a surface mount device jumper adapted for electrically connecting a pair of conductive traces on a printed circuit board.

BACKGROUND OF THE INVENTION

Surface mount device jumpers, commonly known as "SMD jumpers", are well known in the art. One such SMD jumper is disclosed in United States Patent Publication 2002/0144841 to Hua et al. This SMD jumper is used for connection to a conductive trace on a printed circuit board and includes a conductive jumper element and at least two conductive terminals. The conductive jumper element has a cross-sectional area substantially greater than that of the trace. The at least two conductive terminals connect the jumper element to the trace.

U.S. Pat. No. 5,695,348 to Legrady discloses a generally hat-shaped surface mount electrical contact for surface mounting on a generally flat conductive surface of a printed circuit board as shown in FIGS. 16 and 17. The hat-shaped surface mounted electrical contact includes a base which has a generally flat surface suitable for contact with an attachment to a conductive surface of the printed circuit board. An electrical contact, which may be in a form of a pin, post, IDC, test point, receptacle or jumper, has at least one portion projecting from the base in a direction normal to the base. At least one bent intermediate connecting portion integrally connects the contact to the base. The contact, base and bent intermediate connecting portions are all formed from a generally flat sheet of conductive material.

Also, as shown in FIGS. 1A and 1B, a conventional jumper wire 1 can be used to connect a pair of donut-shaped conductive traces 3a and 3b on a conventional printed circuit board 5. A plurality of conductive elements 6 extending parallel to one another are disposed between the pair of conductive traces 3a and 3b. The plurality of conductive traces 6 and outer surface portions of the conventional printed circuit board 5 are covered with conventional solder resist 8. The jumper wire 1 is typically fabricated from copper wire plated with a tin coating. To assemble the jumper wire to the printed circuit board 5, a dedicated jumper wire insertion device (not shown) is required to insert the jumper wire 1 into the respective pair of holes 7a and 7b as shown in FIG. 1B so that respective ones of the distal ends 1a and 1b of the jumper wire 1 can be soldered to the respective ones of the conductive traces 3a and 3b by solder weldments 9a and 9b. Many manufacturers of printed circuit boards do not have jumper wire insertion devices that are dedicated for inserting jumper wires into printed circuit boards.

Further, a conventional SMD chip resistor with 0 ohms might be employed. However, a total length of the conventional SMD chip resistor with 0 ohms is limited in length. The length is typically 3.2 millimeters or less. In practice, this length can be longer. However, the base material used for this chip resistor is ceramic. It is postulated that the ceramic material contributes to solder fatigue and subsequent solder failure after use over a relatively long period of time due to a mismatch of thermal coefficients with the main circuit board material which is a plastic based FR-1 or CEM-1.

It would be beneficial to provide a surface mount device jumper that is compatible for use with a printed circuit board designed to employ jumper wires. It would also be beneficial to provide a surface mount device jumper that can be fabricated at a variety of desired lengths and particularly at a length greater than 3.2 millimeters without using a ceramic base material. It would be advantageous to provide a surface mount device jumper that can be picked-up and placed on a printed circuit board by conventional SMD placer equipment. The present invention provides these benefits and this advantage.

OBJECTS AND SUMMARY OF THE INVENTION

It is an object of the invention to provide a surface mount device jumper that is compatible for use with a printed circuit board designed to employ jumper wires.

It is another object of the invention to provide a surface mount device jumper that can be fabricated at a variety of desired lengths and particularly at a length greater than 3.2 millimeters without using a ceramic base material.

Yet another object of the present invention is to provide a surface mount device jumper that can be picked-up and placed on a printed circuit board by conventional SMD placer equipment.

Accordingly, a surface mount device jumper of the present invention includes a base member and an electrode member. The base member is fabricated from a resin laminate. The electrode member is fabricated from an electrically-conductive material and is formed in a generally C-shaped configuration to define an opening therethrough. The opening is sized to receive the base member such that the electrode member partially wraps around and clamps to the base member to retain the base member in the opening.

These objects and other advantages of the present invention will be better appreciated in view of the detailed description of the exemplary embodiments of the present invention with reference to the accompanying drawings, in which:

BRIEF DESCRIPTION OF THE DRAWINGS

FIG. 23 is a perspective view of an eighth exemplary embodiment of a surface mount device jumper assembly of the present invention.

FIG. 24 is a top planar view of the surface mount device jumper assembly in FIG. 23.

DETAILED DESCRIPTION OF THE EXEMPLARY EMBODIMENTS

A first exemplary embodiment of a surface mount device jumper 10 of the present invention is introduced in FIGS. 2-6 The surface mount device jumper 10, hereinafter referred to "SMD jumper 10", includes a base member 12 and an electrode member 14 and is parallelepiped shaped, i.e. box shaped. The base member 12 is fabricated from a resin laminate such as glass-epoxy, for instance, FR-4 and CEM-3, or a polymide, for instance, FPC. The electrode member 14 is fabricated from an electrically-conductive material such as copper, silver, gold or other electrically-conductive metal. The electrode 14 is formed in a generally C-shaped configuration as best shown in cross-section in FIG. 5.

Figure 1A:
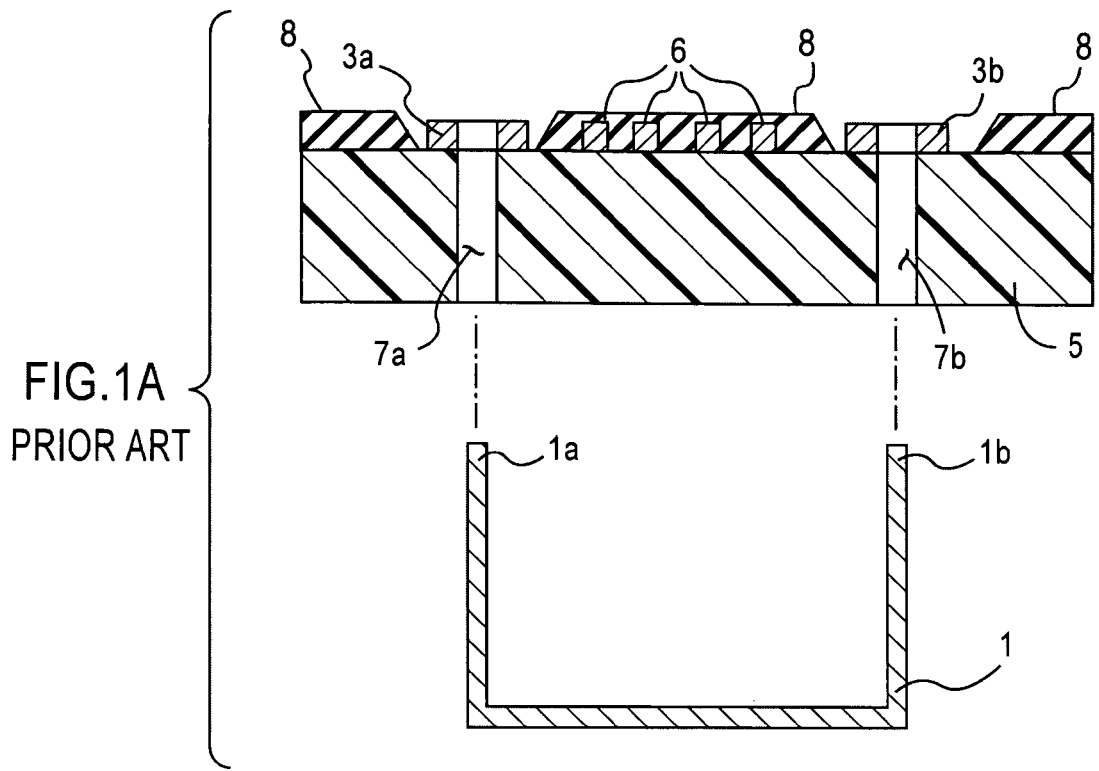
FIG. 1A is a side elevational view shown substantially in cross-section of a conventional jumper wire positioned for insertion into a conventional printed circuit board.
Figure 1B:
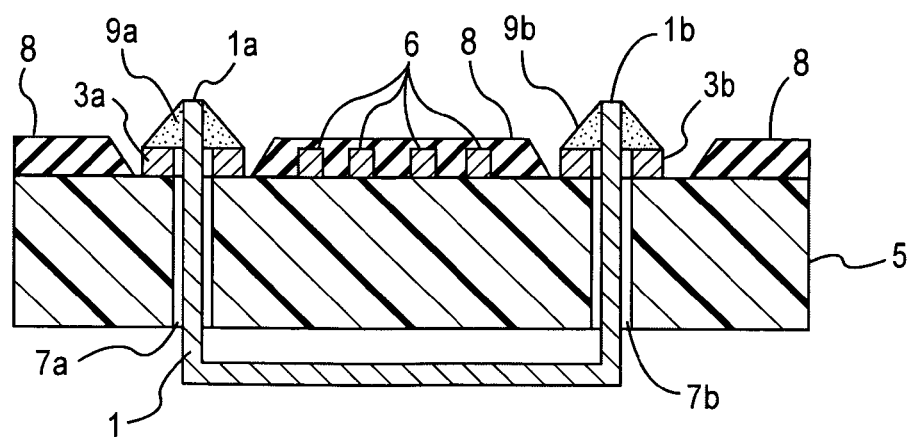
FIG. 1B is a side elevational view shown substantially in cross-section of the conventional jumper wire inserted into the conventional printed circuit board and soldered to a pair of conductive traces.
Figure 2:
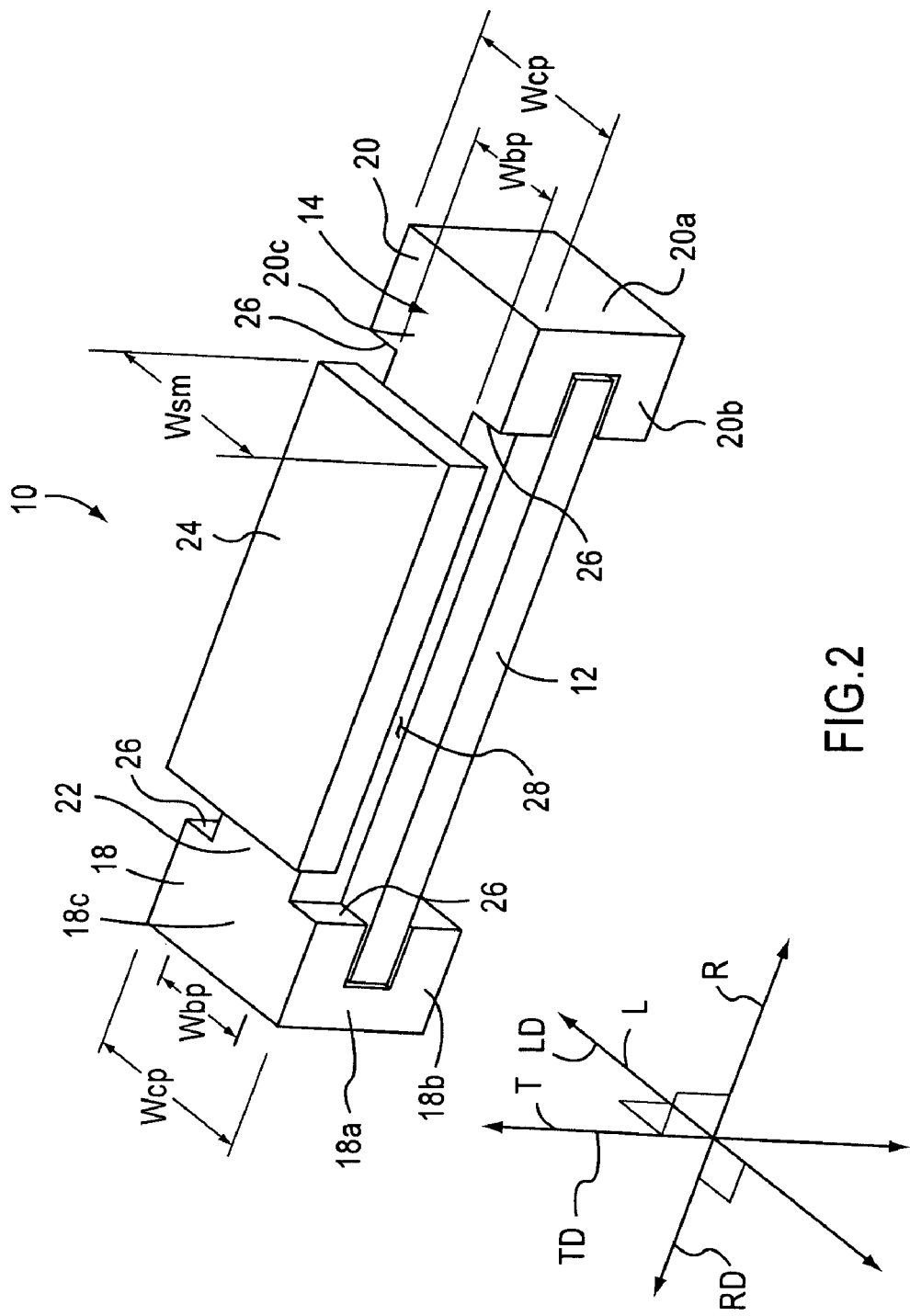
FIG. 2 is a perspective view of a first exemplary embodiment of a surface mount device jumper of the present invention.
Figure 3:
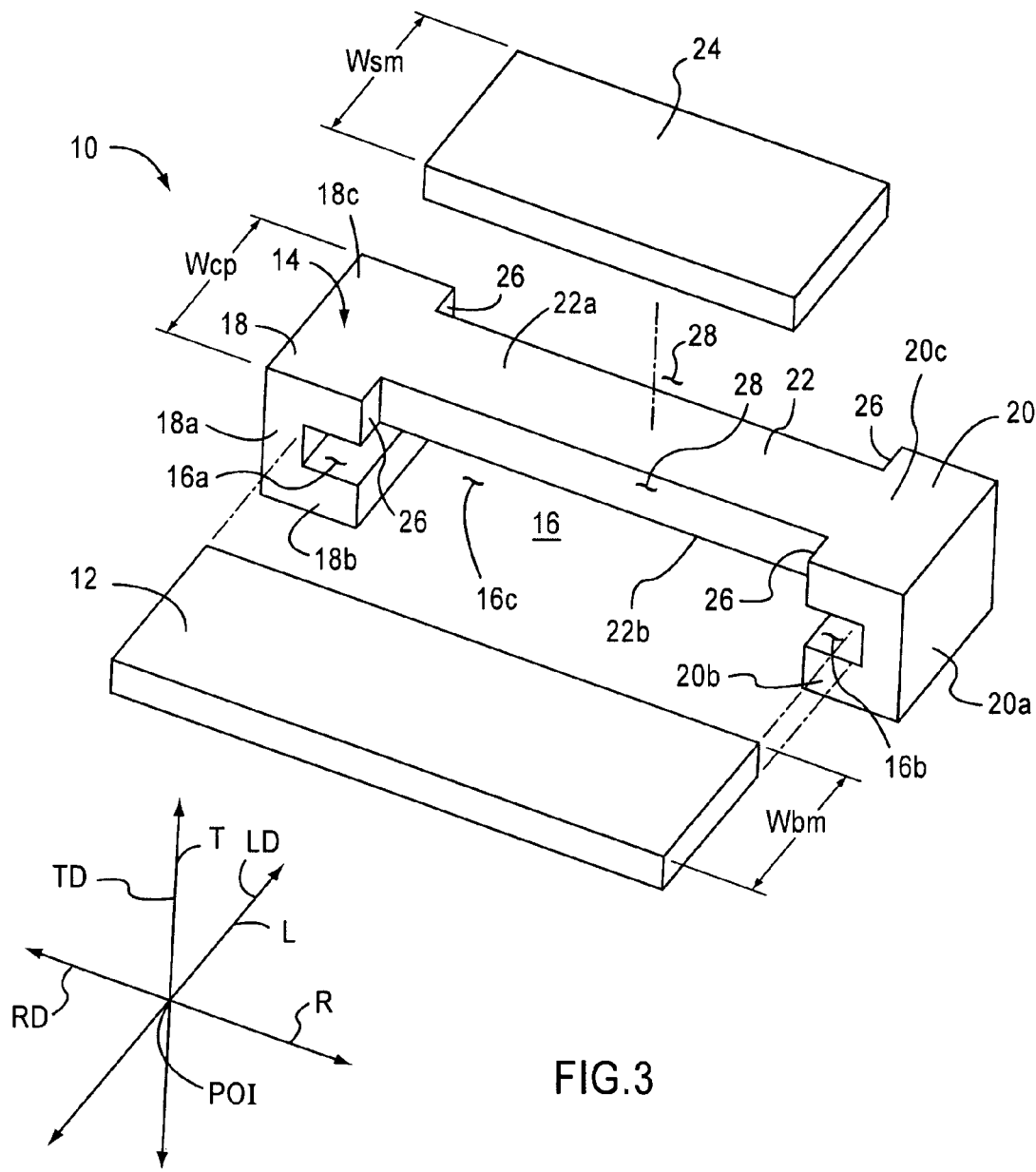
FIG. 3 is an exploded perspective view of the surface mount device jumper in FIG. 2.
Figure 5:
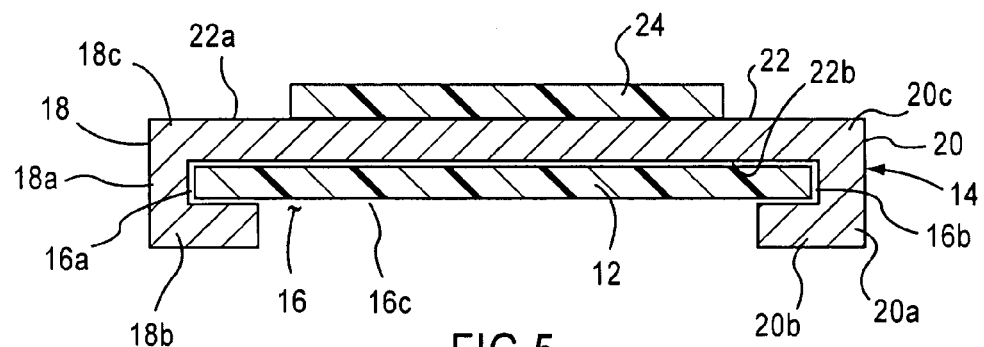
FIG. 5 is a side elevational view shown in cross-section taken along line 5-5 in FIG. 4.
Figure 6:
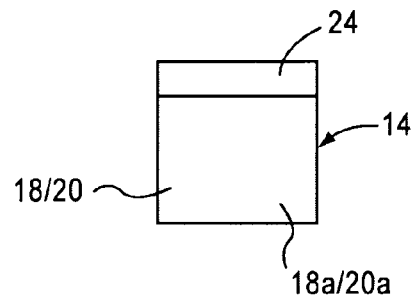
FIG. 6 is a side elevational view of the surface mount device jumper in FIG. 2.

One of ordinary skill in the art would appreciate that the C-shaped configuration as shown in FIGS. 2, 3 and 5 illustrate that the C-shaped configuration is facing downwardly toward the bottom of the drawing sheet and by simply rotating the downwardly facing C-shaped configuration in FIG. 5, for example, counterclockwise 90° would render the C-shaped configuration as a typical upright "C". Furthermore, although not by way of limitation, one of ordinary skill in the art would appreciate that the C-shaped configuration is generally "squared" as explained in more detail hereinbelow.

As best illustrated in FIG. 2, the base member 12 and the electrode member 14 are considered, for orientation purposes, to extend along and about a longitudinal axis L in a longitudinal direction LD indicated by the arrows, a lateral axis R in a lateral direction RD indicated by the arrows and a transverse axis T in a transverse direction TD indicated by the arrows. The longitudinal axis L, the lateral axis R and the transverse axis T intersect one another at a point of intersection POI and extend perpendicularly relative to each other at the point of intersection POI as reflected by the appropriate boxes adjacent the point of intersection POI.

With reference to FIGS. 3 and 5, the C-shaped configuration of the electrode member 14 defines an opening 16 that extends longitudinally through the electrode member 14. The opening 16 is sized to receive the base member 12 in a manner such that the electrode member 14 partially wraps around and clamps to the base member 12 as best shown sequentially in FIGS. 25A and 25B discussed in more detail below. In this manner, the electrode member 14 retains the base member 12 in the opening 16.

As shown in FIG. 3, the opening 16 has a generally U-shaped opening section 16a, an inverse generally U-shaped opening section 16b that faces the U-shaped opening section 16a and an intermediate opening section 16c disposed between the U-shaped opening section 16a and the inverse U-shaped opening section 16b. In other words, the U-shaped opening section 16a, the inverse U-shaped opening section 16b and the intermediate opening section 16c constitute the opening 16.

In FIGS. 3 and 5, the electrode member 14 has a generally U-shaped clamp portion 18, an inverse generally U-shaped clamp portion 20 and a bridge portion 22. The bridge portion 22 interconnects the U-shaped clamp portion 18 and the inverse U-shaped clamp portion 20 as an integral construction. The U-shaped clamp portion 18 forms the U-shaped opening section 16a and the inverse U-shaped clamp portion forms the inverse U-shaped opening section 16b.

Again, with reference to FIGS. 3 and 5, the bridge portion 22 has a bridge portion outer surface 22a and an opposite bridge portion inner surface 22b. Note that the bridge portion inner surface 22b defines, in part, the intermediate opening section 16c and, when base member 12 and the electrode member 14 are assembled together as shown in FIG. 2, the bridge portion inner surface 22b contacts the base member 12 (FIG. 5). The opening 16 is formed by the U-shaped opening section 16a, the inverse U-shaped opening section 16b and the intermediate opening section 16c. A top-side solder mask 24 is disposed on the bridge portion outer surface 22a and is connected thereto. The top-side solder mask 24 at least partially covers the bridge portion outer surface 22a. By way of example only in the first exemplary embodiment of the SMD jumper of the present invention, the top-side solder mask 24 substantially covers the bridge portion outer surface 22a.

In FIGS. 2-6, the U-shaped clamp portion 18 includes a web 18a, a flange 18b and a bridge-connecting flange 18c and the inverse U-shaped clamp portion 20 includes an inverse web 20a, an inverse flange 20b and an inverse bridge-connecting flange 20c. The flange 18b and the bridge-connecting flange 18c extend parallel with one another and connect to and extend perpendicularly from the web 18a to define the U-shaped opening section 16a. The inverse flange 20b and the inverse bridge-connecting flange 20c extend parallel with one another and connect to and extend perpendicularly from the inverse web 20a to define the inverse U-shaped opening section 16b. The bridge portion 22 is connected to and between the bridge-connecting flange 18c and the inverse bridge-connecting flange 20a as an integral construction. By way of example only and not by way of limitation, the bridge portion 22, the web 18a, the flange 18b, the bridge-connecting flange 18c, the inverse web 22a, the inverse flange 22b and the inverse bridge-connecting flange 22c are parallelepiped shaped.

Figure 4:
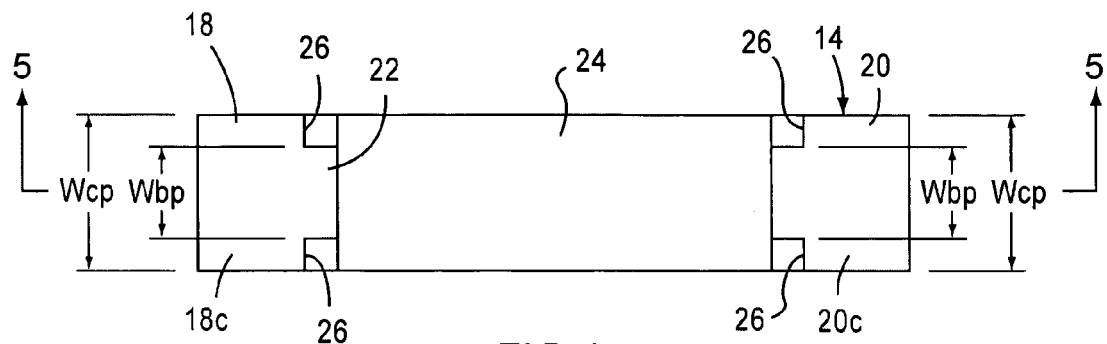
FIG. 4 is a top planar view of the surface mount device jumper in FIG. 2.

As best shown in FIG. 5, both of the U-shaped opening section 16a and the inverse U-shaped opening section 16b are rectangularly configured as viewed in this cross-sectional view. With reference to FIGS. 2 and 4, each one of the U-shaped clamp portion 18 and the inverse U-shaped clamp portion 20 extend along the longitudinal direction LD (FIG. 2) at a clamp portion width Wcp and the bridge portion 22 extends along the longitudinal direction LD (FIG. 2) at a bridge portion width Wbp less than the clamp portion width Wcp. With the bridge portion width Wbp being less than the clamp portion width Wcp, the bridge portion 22 and interior corner portions 26 of respective ones of the U-shaped clamp portion 18 and the inverse U-shaped clamp portion 20 form a pair of laterally-extending recesses 28 as best shown in FIG. 3. The recesses 28 are formed between the bridge portion 22 and the U-shaped and inverse U-shaped clamp portions 18 and 20 respectively. Each one of the U-shaped clamp portion 18 and the inverse U-shaped clamp portion 20 extends along the longitudinal direction LD (FIG. 2) at the clamp portion width Wcp and the top-side solder mask has a top-side solder mask width Wsm extending along the longitudinal direction LD (FIG. 2) is equal to or at least substantially equal to or less than the clamp portion width Wcp. With reference to FIG. 3, the base member 12 has a base member width Wbm that is equal to or substantially equal to the clamp portion width Wcp for the first exemplary embodiment of the SMD jumper 10 of the present invention.

Figure 7:
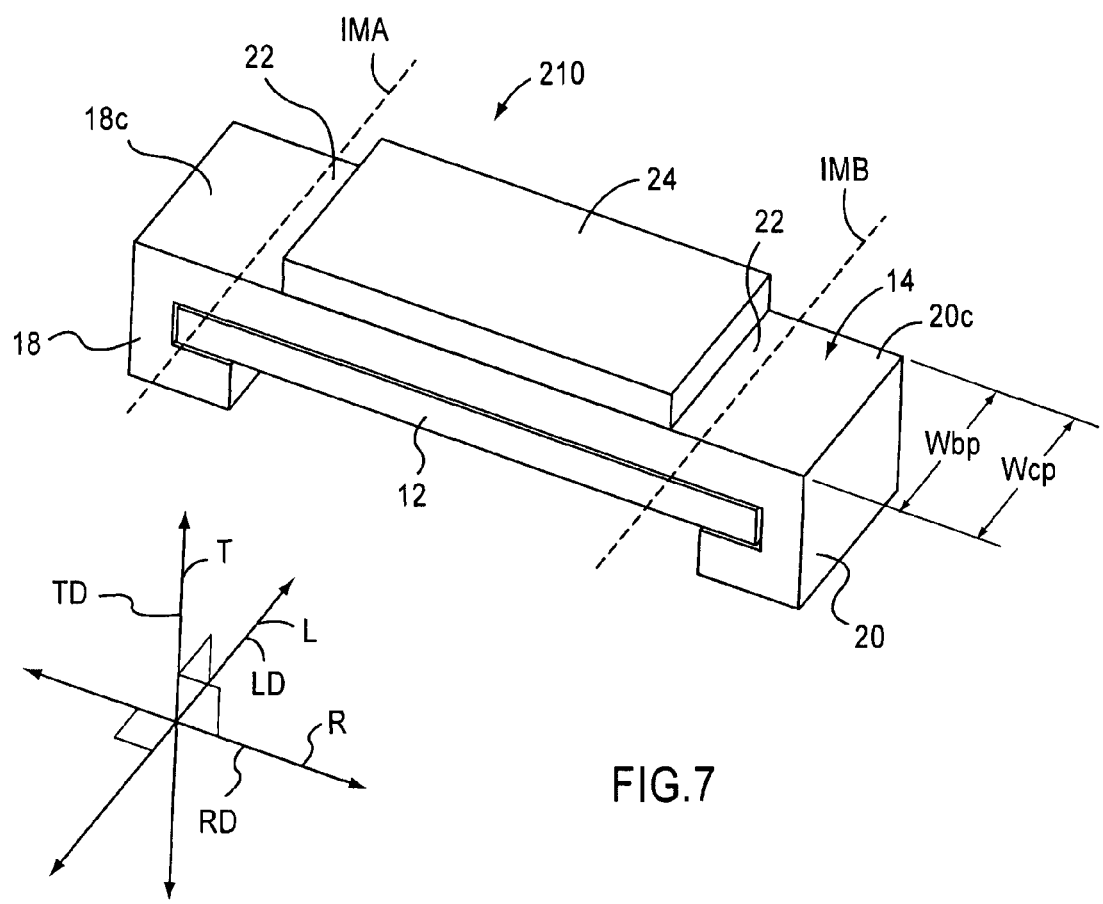
FIG. 7 is a perspective view of a second exemplary embodiment of a surface mount device jumper of the present invention.
Figure 8:
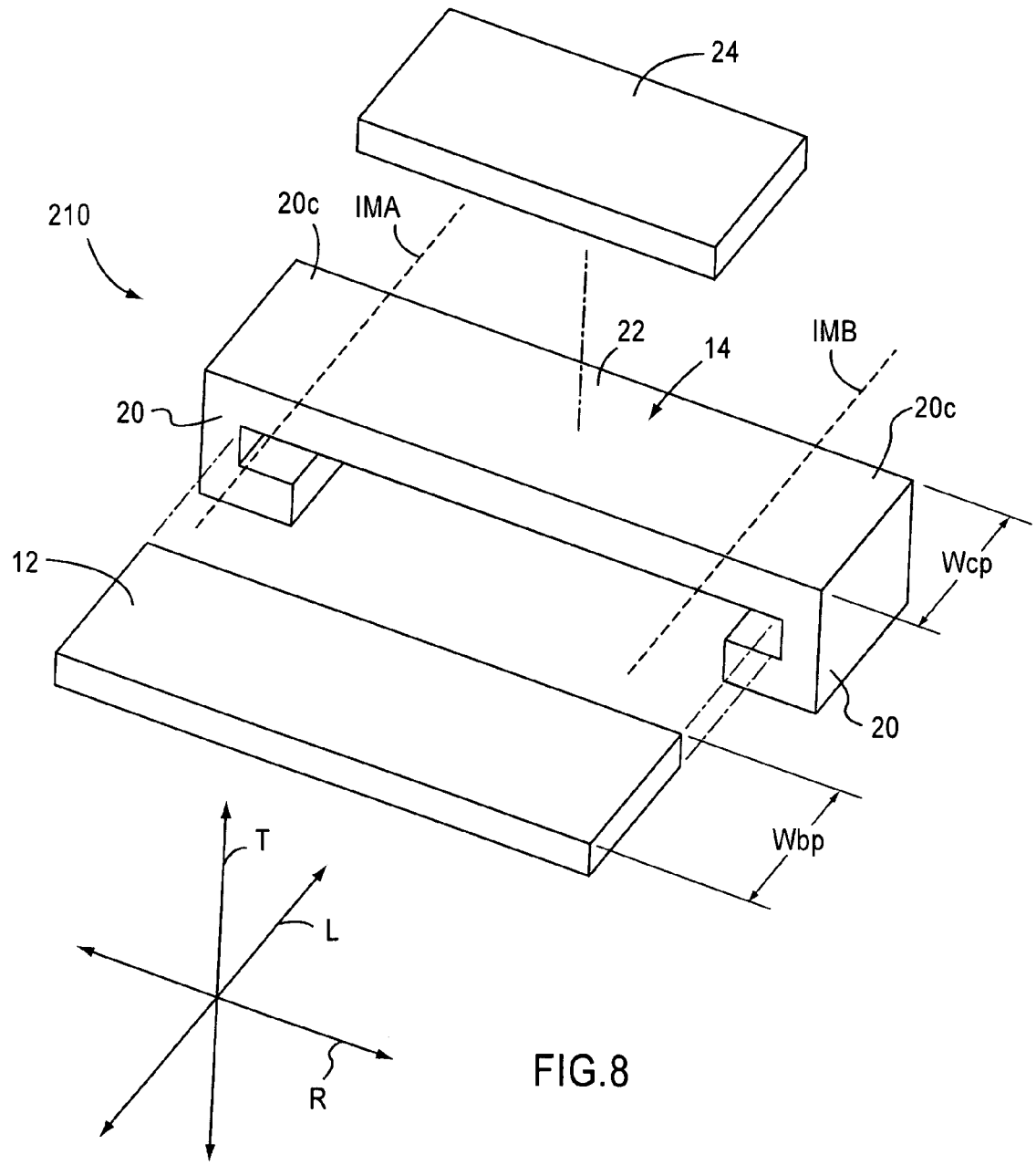
FIG. 8 is an exploded perspective view of the surface mount device jumper in FIG. 7.
Figure 9:
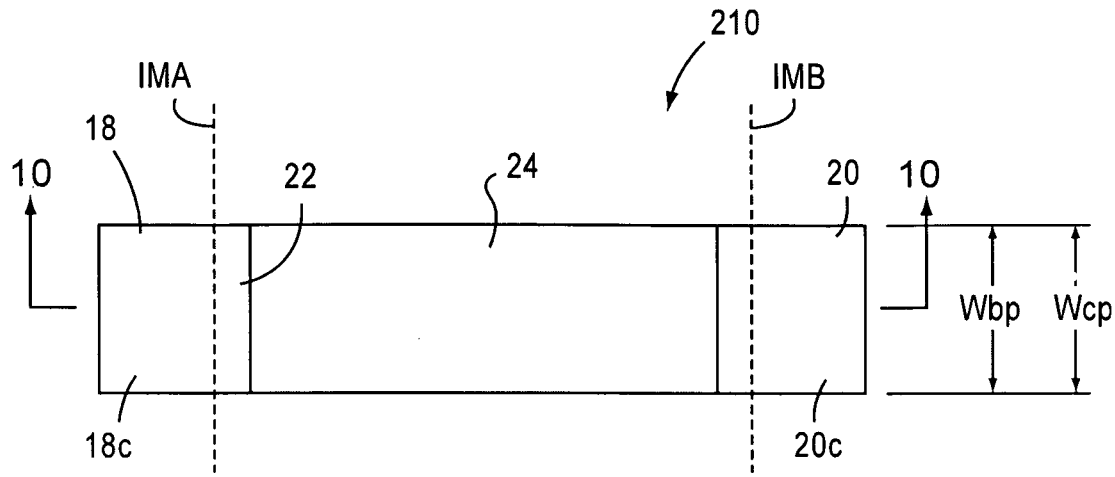
FIG. 9 is a top planar view of the surface mount device jumper in FIG. 7.
Figure 10:
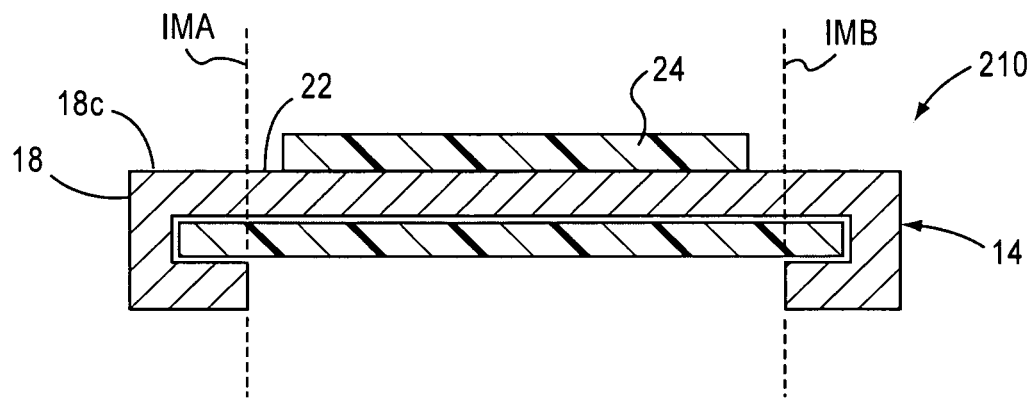
FIG. 10 is a side elevational view shown in cross-section taken along line 10-10 in FIG. 9.
Figure 11:
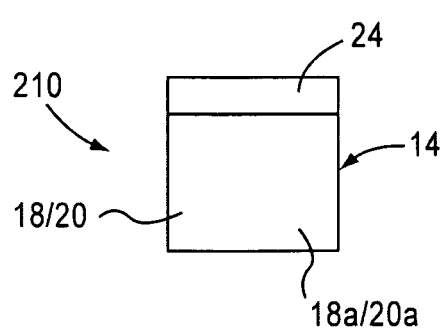
FIG. 11 is a side elevational view of the surface mount device jumper in FIG. 7.

A second exemplary embodiment of a SMD jumper 210 of the present invention is introduced in FIGS. 7-11. The second exemplary embodiment of the SMD jumper 210 is similar to the first exemplary embodiment of the SMD jumper 10 described above except for the bridge portion width Wbp. The difference is the that bridge portion width Wbp is equal to or at least substantially equal to the clamp portion width Wcp as shown in FIGS. 7-9. In FIGS. 7-10, a dashed imaginary line IMA is illustrated to delineate between the U-shaped clamp portion 18 and the bridge portion 22 and a dashed imaginary line IMb is illustrated to delineate between the inverse U-shaped clamp portion 20 and the bridge portion 22.

Figure 12:
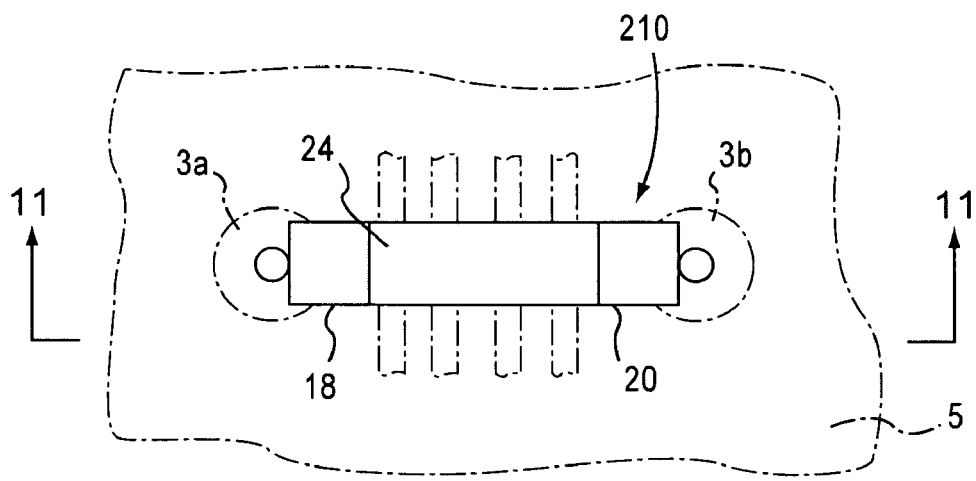
FIG. 12 is a top planar view of the surface mount device jumper in FIG. 7 disposed on a conventional printed circuit board.
Figure 13:
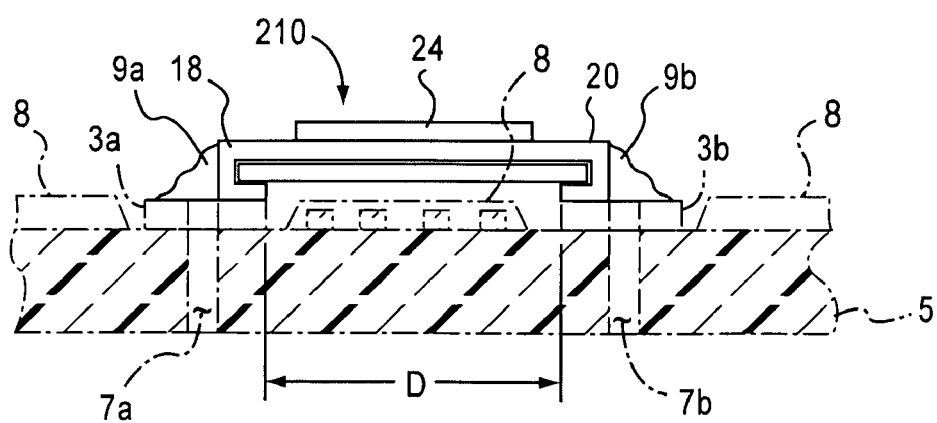
FIG. 13 is a side elevational view shown in partially in cross-section and taken along line 11-11 in FIG. 12.

By way of example only and not by way of limitation, the surface mount device jumper 210, shown in FIGS. 12 and 13, is adapted for electrically connecting the pair of disposed-apart conductive traces 3a and 3b on the printed circuit board 5. In FIG. 12, the SMD jumper 210 is not yet soldered to the conductive traces 3a and 3b. In FIG. 13, the SMD jumper 210 is soldered to the conductive traces 3a and 3b by the solder weldments 9a and 9b. As is commonly known in the art, the U-shaped clamp portion 18 and the inverse U-shaped clamp portion 20 are disposed apart from one another at a distance D sufficient to electrically connect, i.e. bridge, the pair of conductive traces 3a and 3b on the printed circuit board 5.

Figure 14:
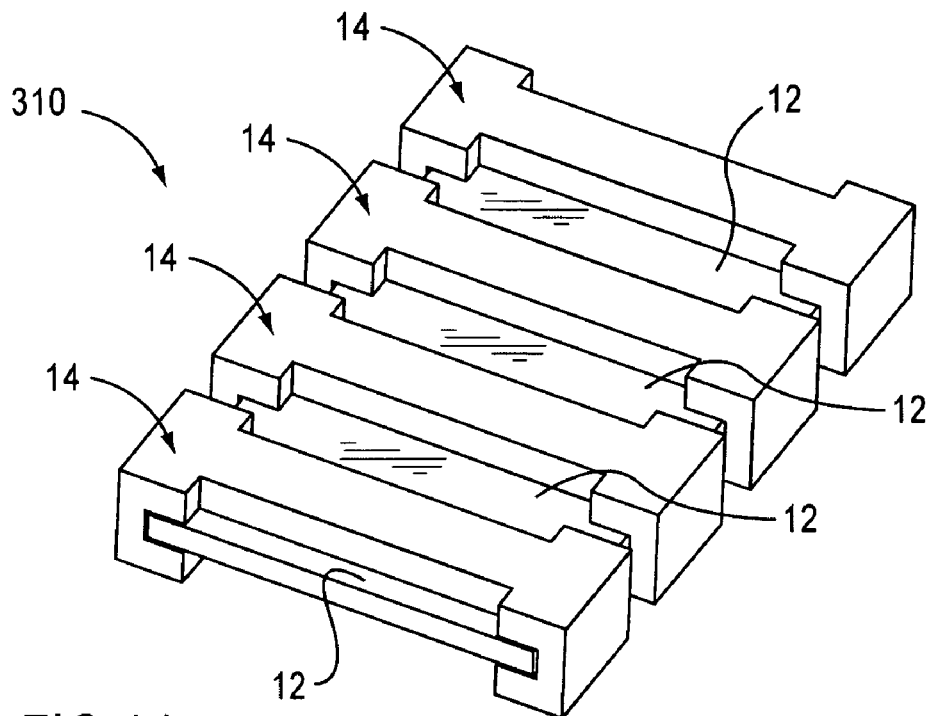
FIG. 14 is a perspective view of a third exemplary embodiment of a surface mount device jumper assembly of the present invention.
Figure 15:
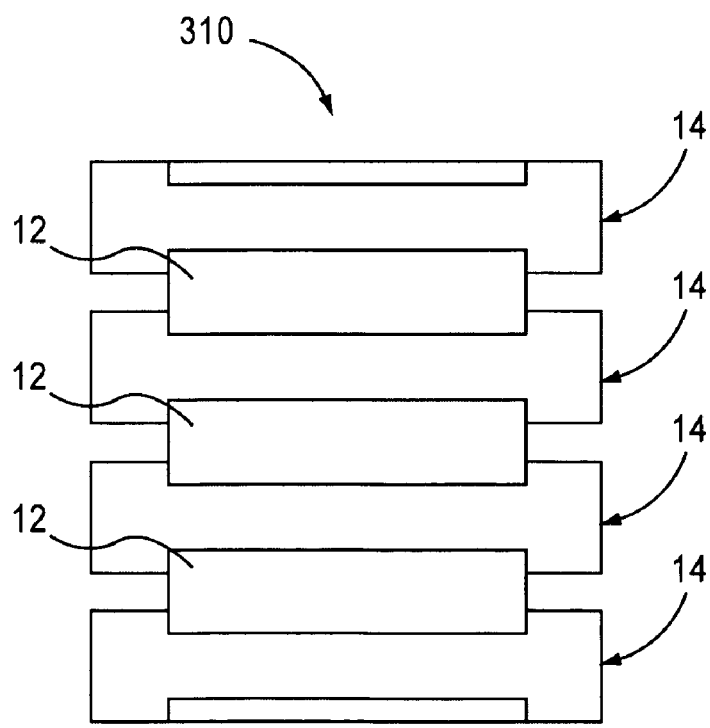
FIG. 15 is a top planar view of the surface mount device jumper assembly in FIG. 14.

A third exemplary embodiment of a surface mount device jumper assembly 310 of the present invention is introduced in FIGS. 14 and 15. The surface mount device jumper assembly 310 includes a longitudinally-extending base member 12 and a plurality of laterally-extending electrode members 14. Sequential ones of the plurality of electrode members 14 are longitudinally disposed apart and electrically isolated from one another. In brief, the surface mount device jumper 310 is similar to the embodiments described above except that a plurality of longitudinally spaced-apart electrode members 14 are partially wrapped around and clamped to a single, unitary, longitudinally-extending base member 12.

Figure 16:
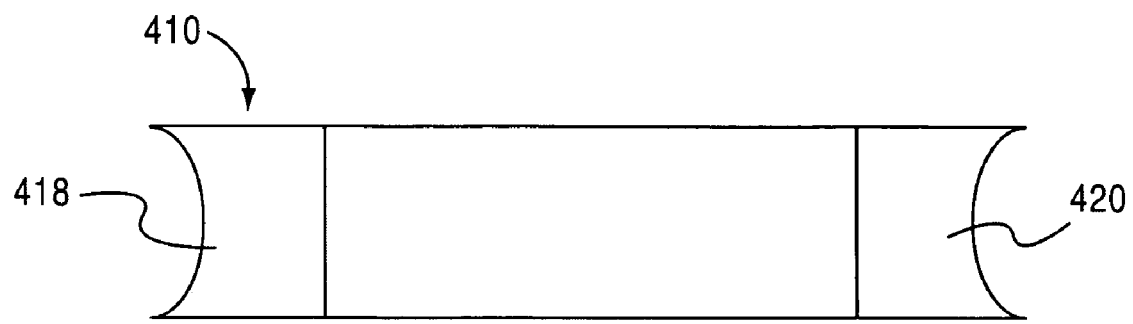
FIG. 16 is a top plan view of a fourth exemplary embodiment of a surface mount device jumper of the present invention.

A fourth exemplary embodiment of a SMD jumper 410 of the present invention is shown in top plan view in FIG. 16. The fourth exemplary embodiment of the surface mount device jumper assembly 410 is similar to the second exemplary embodiment of the surface mount device jumper 210 except that both the U-shaped clamp portion 418 and the inverse U-shaped clamp portion 420 have a convex configuration.

Figure 17:
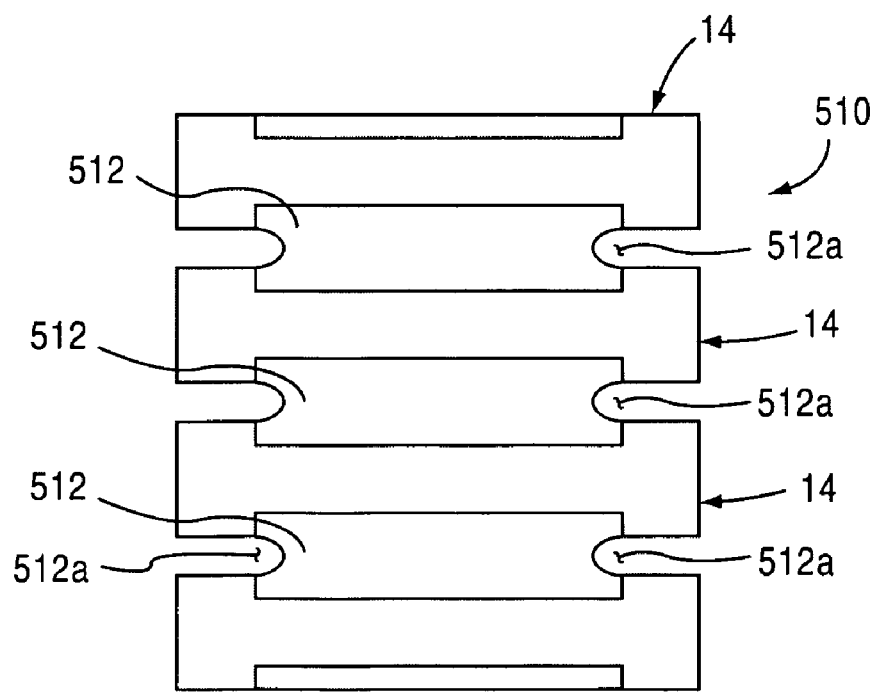
FIG. 17 is a top planar view of a fifth exemplary embodiment of the surface mount device jumper of the present invention.

A fifth exemplary embodiment of a surface mount device jumper assembly 510 of the present invention is introduced in FIG. 17. The surface mount device jumper assembly 510 is similar to the third exemplary embodiment of the surface mount device jumper assembly 310 of present invention illustrated in FIGS. 14 and 15 except the base member 512 includes a plurality of notches 512a that are disposed between sequential ones of the plurality of laterally-extending electrode members 14.

Figure 18:
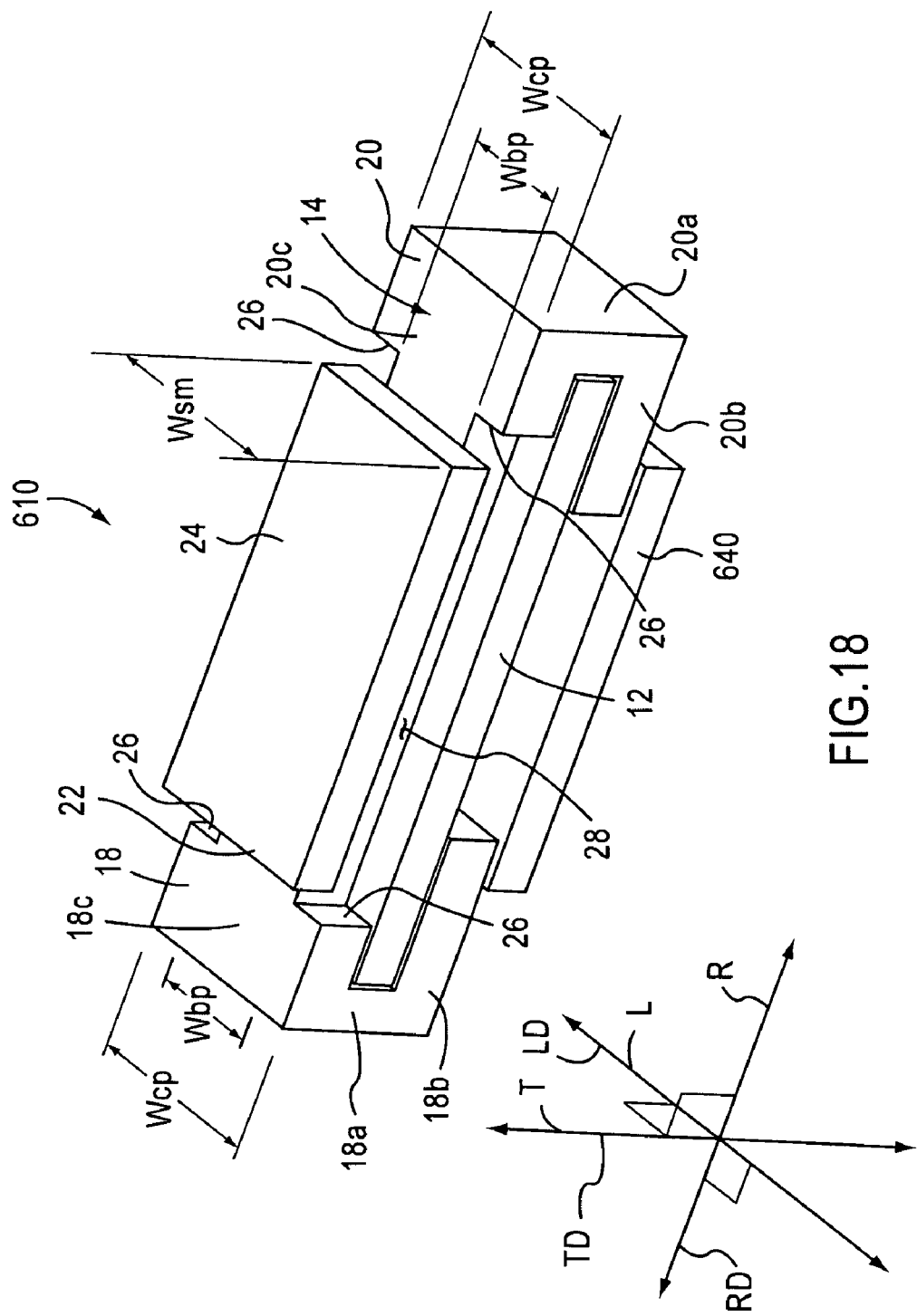
FIG. 18 is a perspective view of a sixth exemplary embodiment of a surface mount device jumper of the present invention.
Figure 19:
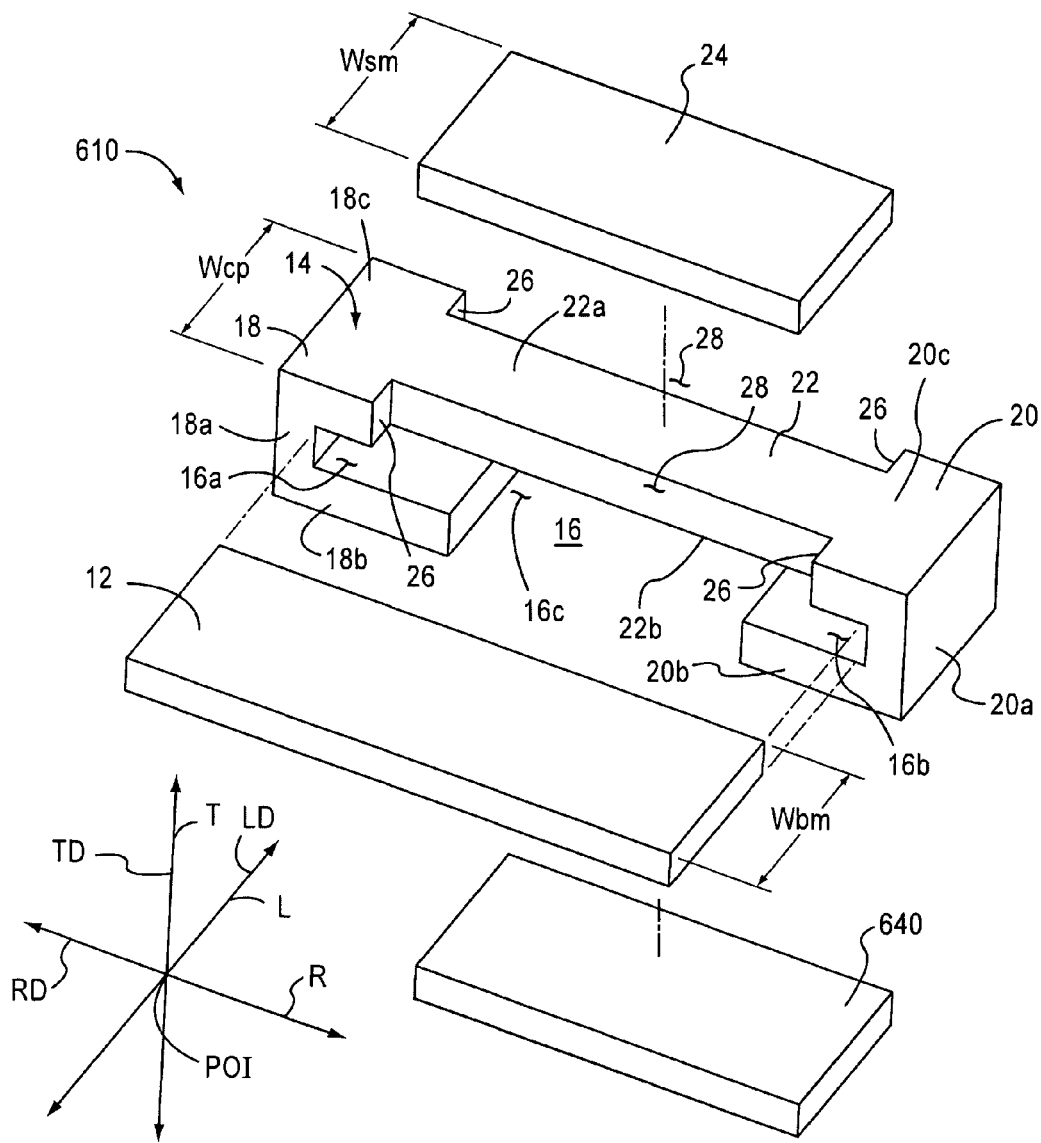
FIG. 19 is an exploded perspective view of the sixth exemplary embodiment of a surface mount device jumper of the present invention shown in FIG. 18.

A sixth exemplary embodiment of a SMD jumper 610 of the present invention is introduced in FIGS. 18 and 19. The sixth exemplary embodiment of the SMD jumper 610 is similar to the first exemplary embodiment of the SMD jumper 10 described above except that a bottom-side solder mask 640 is included. The bottom-side solder mask 640 is connected to the flange 18b of the U-shaped clamp portion 18 and the inverse flange 20b of the inverse U-shaped clamp portion 20.

Figure 20:
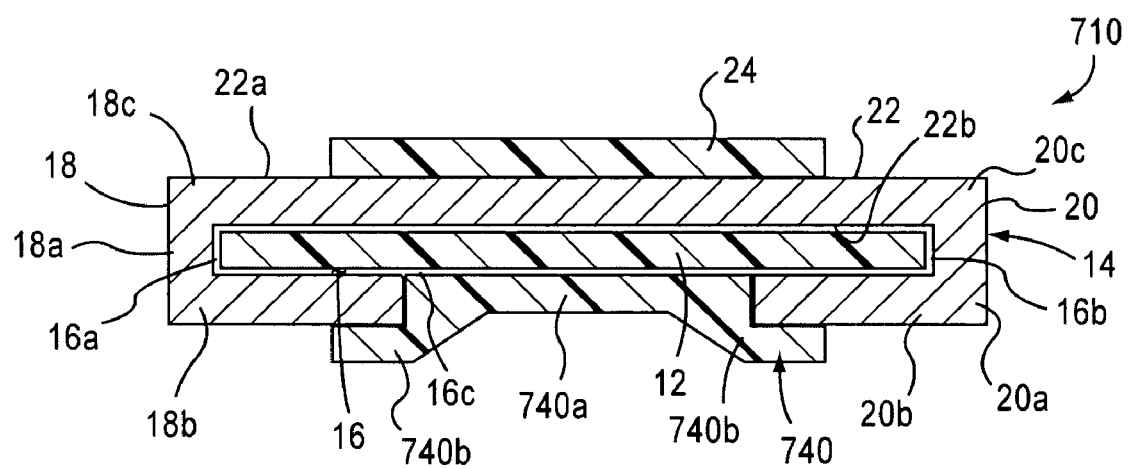
FIG. 20 is a side elevational view shown in cross-section of a seventh exemplary embodiment of a surface mount device jumper of the present invention.
Figure 21:
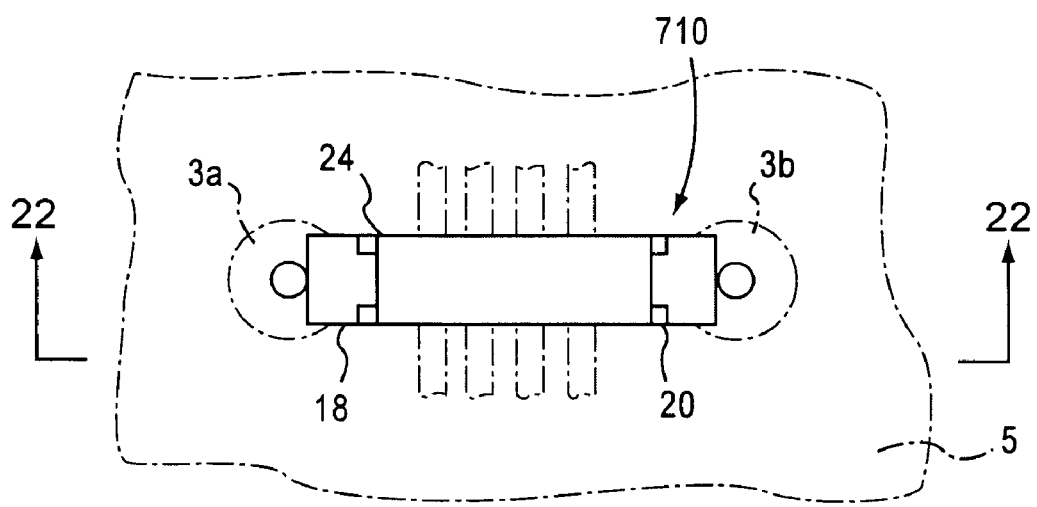
FIG. 21 is a top planar view of the surface mount device jumper in FIG. 20 disposed on a conventional printed circuit board.
Figure 22:
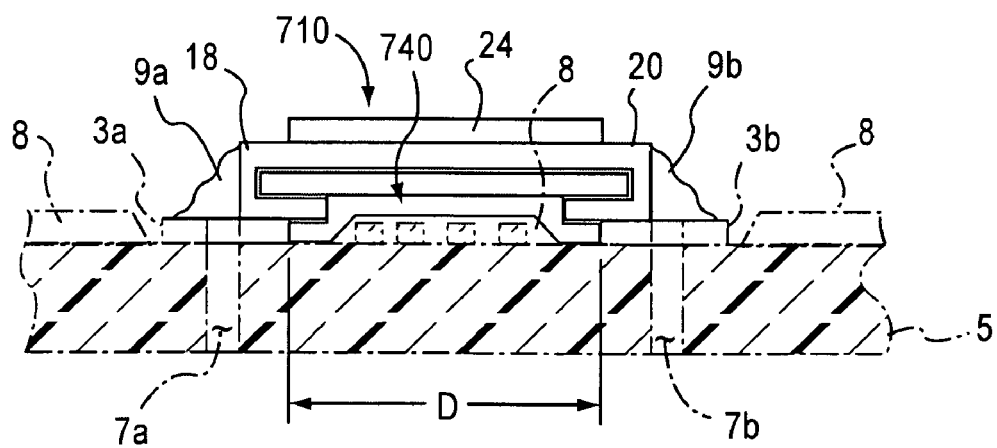
FIG. 22 is a side elevational view shown in partially in cross-section and taken along line 22-22 in FIG. 21.

A seventh exemplary embodiment of a SMD jumper 710 of the present invention is introduced in FIGS. 20-22. The seventh exemplary embodiment of the SMD jumper 710 is similar to the sixth exemplary embodiment of the SMD jumper 610 described above except for the configuration of the bottom-side solder mask 740. The bottom-side solder mask 740 is connected to and between the flange 18b of the U-shaped clamp portion 18 and the inverse flange 20b of the inverse U-shaped clamp portion 20 by a central bottom-side solder mask portion 740a. Also, a pair of feet 740b are integrally formed with the central bottom-side sold mask portion 740a to form a generally hat-shaped configuration. As appreciated by one of ordinary skill in the art, the SMD jumper 710 of the present invention is shown attached to a conventional printed circuit board 5.

An eighth exemplary embodiment of a surface mount device jumper assembly 810 of the present invention is introduced in FIGS. 23 and 24. The surface mount device jumper assembly 810 is similar to the third exemplary embodiment of the surface mount device jumper 310 in FIGS. 14 and 15 except the eighth exemplary embodiment of the surface mount device jumper includes a top-side solder mask 824 as well as a bottom-side solder mask 840.

In view of the above, the surface mount device jumper and the surface mount device jumper assembly of the present invention are compatible for use with conventional printed circuit boards designed to employ jumper wires. Also, the surface mount device jumper and the surface mount device jumper assembly of the present invention can be fabricated at a variety of desired lengths and particularly at lengths greater than 3.2 millimeters by employing a base member that is not fabricated from a ceramic material. Further, the surface mount device jumper can be picked-up and placed on a printed circuit board by conventional SMD placer equipment.

Figure 25A:
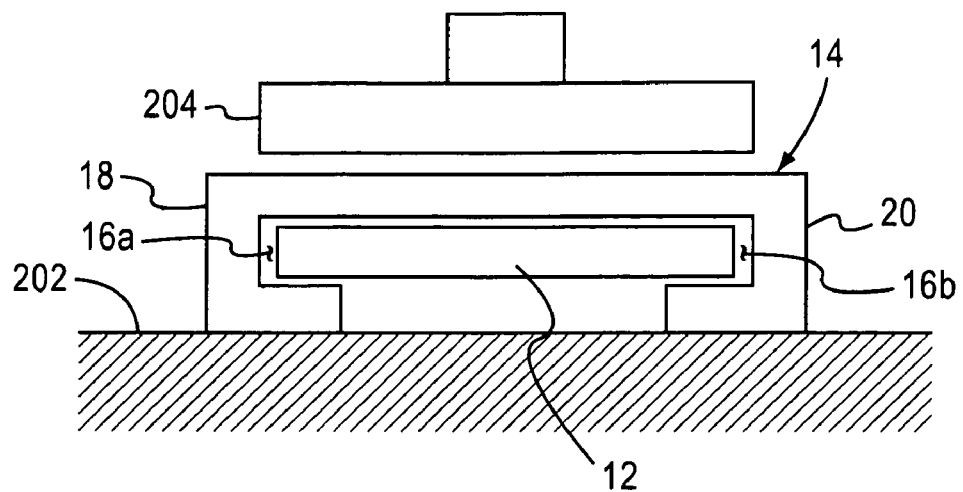
FIGS. 25A and 25B are side elevational views illustrating, in sequence, a conventional pressing device causing a base member of the surface mount device jumper of the present invention to be clamped to an electrode member of the surface mount device jumper of the present invention.
Figure 25B:
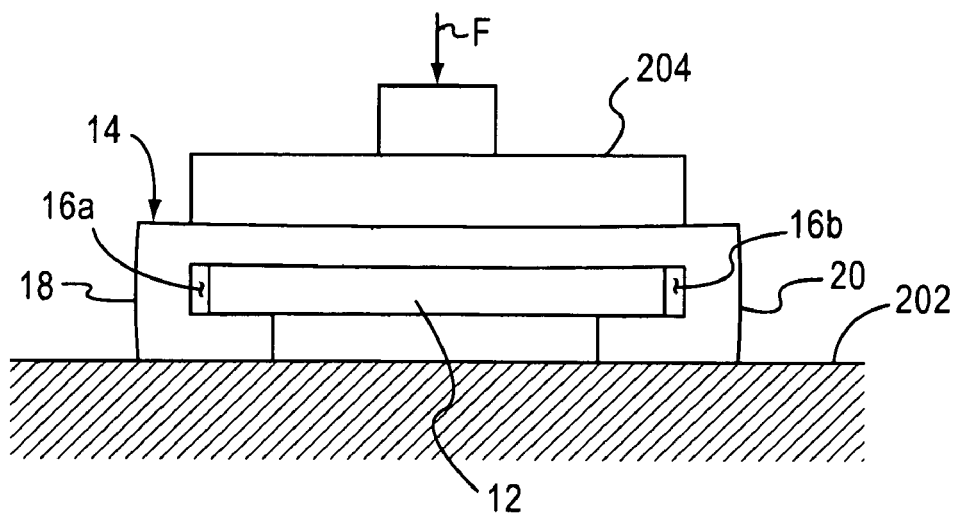

As shown in FIGS. 25A and 25B, a conventional pressing device 204 presses the electrode member 14 resting on a support surface 202 with a force F so that respective ones of the generally U-shaped clamp portion 18 and the inverse generally U-shaped clamp portion 20 clamp respective end portions of the base member 12. Alternatively, a skilled artisan would appreciate that a thickness of the base member 12 might be substantially equal to the respective widths of the U-shaped opening section 16a and the inverse U-shaped opening section 16b as viewed in the transverse direction TD so that the base member 12 can be slidably force-fitted into the opening 16.

The present invention, may, however, be embodied in various different forms and should not be construed as limited to the exemplary embodiments set forth herein; rather, these exemplary embodiments are provided so that this disclosure will be thorough and complete and will fully convey the scope of the present invention to those skilled in the art.

What is claimed is:

1. A surface mount device jumper, comprising:
   a base member fabricated from a resin laminate and shaped in a parallelepiped configuration having a thickness; and
   an electrode member having a thickness body extending along and about a longitudinal axis in a longitudinal direction, a lateral axis in a lateral direction and a transverse axis in a transverse direction with the longitudinal axis, the lateral axis and the transverse axis intersecting one another at a point of intersection and perpendicularly relative to one another, the lateral axis and the transverse axis forming a lateral-transverse plane, the electrode member fabricated from an electrically-conductive material and formed in a generally C-shaped configuration viewed in the lateral-transverse plane to define an opening extending in the longitudinal direction into and through the electrode member, the opening sized to be slidably force-fitted to receive the base member in the longitudinal direction such that the electrode member partially wraps around respective opposing end portions of the base member as viewed in side elevation and the electrode member clamps to the respective opposing end portions of the base member to retain the base member in the opening;
   wherein the electrode member has a U-shaped clamp portion forming a U-shaped opening section at one end thereof, an inverse U-shaped clamp portion at the other end thereof forming an inverse U-shaped opening section facing the U-shaped opening section and a bridge portion interconnecting the U-shaped clamp portion and the inverse U-shaped clamp portion to form an integral construction, wherein the thickness body of the electrode member is substantially equal to the thickness of the base member.

2. A surface mount device jumper according to claim 1, wherein the bridge portion has a bridge portion outer surface and an opposite bridge portion inner surface, the bridge portion inner surface defining, in part, an intermediate opening section, the opening being formed by the U-shaped opening section, the inverse U-shaped opening section and the intermediate opening section disposed between the U-shaped opening section and the inverse U-shaped opening section.

3. A surface mount device jumper according to claim 1, further comprising a top-side solder mask disposed on and at least partially covering the bridge portion outer surface.

4. A surface mount device jumper adapted for electrically connecting a pair of disposed-apart conductive traces on a printed circuit board, the surface mount device comprising:
   a base member fabricated from a resin laminate and shaped in a parallelepiped configuration having a thickness; and
   an electrode member having a thickness body extending along and about a longitudinal axis in a longitudinal direction, a lateral axis in a lateral direction and a transverse axis in a transverse direction with the longitudinal axis, the lateral axis and the transverse axis intersecting one another at a point of intersection and perpendicularly relative to one another, the lateral axis and the transverse axis forming a lateral-transverse plane, the electrode member fabricated from an electrically-conductive material and formed in a generally square C-shaped configuration viewed in the lateral-transverse plane to define an opening extending in the longitudinal direction into and through the electrode member,
   wherein the electrode member has a U-shaped clamp portion at one end thereof forming a U-shaped opening section, an inverse U-shaped clamp portion at the other end thereof forming an inverse U-shaped opening section facing the U-shaped opening section and a bridge portion interconnecting the U-shaped clamp portion and the inverse U-shaped clamp portion,
   wherein the opening is sized to be slidably force-fitted to receive the base member in the longitudinal direction such that the electrode member partially wraps around respective opposing end portions of the base member as viewed in side elevation and the electrode member clamps to the respective opposing end portions of the base member at respective ones of the U-shaped clamp portion and the inverse U-shaped clamp portion to retain the base member in the opening, and
   wherein the U-shaped clamp portion and the inverse U-shaped clamp portion are disposed apart from one another at a distance sufficient to electrically connect the pair of conductive traces on the printed circuit board, and wherein the thickness body of the electrode member is substantially equal to the base member.

5. A surface mount device jumper according to claim 4, wherein the U-shaped clamp portion includes a web, a flange and a bridge-connecting flange, the flange and the bridge-connecting flange extending parallel with one another and connected to and extending perpendicularly from the web to define the U-shaped opening section and wherein the inverse U-shaped clamp portion includes an inverse web, an inverse flange and an inverse bridge-connecting flange, the inverse flange and the inverse bridge-connecting flange extending parallel with one another and connected to and extending perpendicularly from the inverse web to define the inverse U-shaped opening section.

6. A surface mount device jumper according to claim 5, wherein the bridge portion is connected to and between the bridge-connecting flange and the inverse bridge-connecting flange as an integral construction.

7. A surface mount device jumper according to claim 5, wherein the bridge portion, the web, the flange, the bridge-connecting flange, the inverse web, the inverse flange and the inverse bridge-connecting flange are parallelepiped shaped.

8. A surface mount device jumper according to claim 5, wherein the respective ones of the U-shaped opening section and the inverse U-shaped opening section are configured as rectangles as viewed in cross-section.

9. A surface mount device jumper according to claim 5, each one of the U-shaped clamp portion and the inverse U-shaped clamp portion extend along the longitudinal direction at a clamp portion width and the bridge portion extends along the longitudinal direction at a bridge portion width that is equal to or less than the clamp portion width.

10. A surface mount device jumper according to claim 5, each one of the U-shaped clamp portion and the inverse U-shaped clamp portion extend along the longitudinal direction at a clamp portion width and the bridge portion extends along the longitudinal direction at a bridge portion width that less than the clamp portion width, the bridge portion and interior corner portions of respective ones of the U-shaped clamp portion and the inverse U-shaped clamp portion form a pair of recesses formed between the bridge portion and the U-shaped and inverse U-shaped clamp portions.

11. A surface mount device jumper according to claim 5, wherein the bridge portion has bridge portion outer surface and an opposite bridge portion inner surface, the bridge portion inner surface defining, in part, an intermediate opening section, the opening being formed by the U-shaped opening section, the inverse U-shaped opening section and the intermediate opening section disposed between the U-shaped opening section and the inverse U-shaped opening section.

12. A surface mount device jumper according to claim 11, further comprising a top-side solder mask disposed on, connected to and at least partially covering the bridge portion outer surface.

13. A surface mount device jumper according to claim 12, each one of the U-shaped clamp portion and the inverse U-shaped clamp portion extend along the longitudinal direction at a clamp portion width and the top-side solder mask has a top-side solder mask width being at least substantially equal to or less than the clamp portion width.

14. A surface mount device jumper according to claim 12, further comprising a bottom-side solder mask connected to the flange and the inverse flange.

15. A surface mount device jumper according to claim 11, wherein the bridge portion inner surface contacts the base member.

16. A surface mount device jumper according to claim 5, wherein the resin laminate is one of a glass-epoxy and a polyimide.

17. A surface mount device jumper according to claim 16, wherein the glass-epoxy is one of FR-4 and CEM-3 and the polyimide is FPC.

* * * * *